United States Patent

Parvathala et al.

[19]

[11] Patent Number: 5,872,795
[45] Date of Patent: Feb. 16, 1999

[54] METHOD AND APPARATUS FOR SCAN TESTING OF MULTI-PHASE LOGIC

[75] Inventors: Praveen Parvathala, Phoenix, Ariz.; Fred Gruner, Palo Alto, Calif.

[73] Assignee: Intel Corporation, Santa Clara, Calif.

[21] Appl. No.: 979,195

[22] Filed: Nov. 26, 1997

[51] Int. Cl.$^6$ .................................................. G06F 11/00
[52] U.S. Cl. ............................................................ 371/22.31
[58] Field of Search ............................ 371/22.31, 22.32, 371/22.33, 22.35, 23.36; 395/183

[56] References Cited

U.S. PATENT DOCUMENTS 5,748,497  5/1998  Scott et al. ................................ 371/22

Primary Examiner—Vincent P. Canney
Attorney, Agent, or Firm—Blakely, Sokoloff, Taylor & Zafman LLP

[57] ABSTRACT

A method and apparatus for using a test signal being computed by applying a combinational test pattern generation tool to a model of the apparatus in which at least one of an at least one sequential device is modelled as a non-sequential device, the apparatus having a first scan cell configured to receive the test signal and drive a first signal in response to a first clock phase; a sequential logic block having the at least one sequential device, the sequential logic block being configured to generate a second signal, at least one of the at least one sequential device being a non-scan cell.

16 Claims, 2 Drawing Sheets

METHOD AND APPARATUS FOR SCAN TESTING OF MULTI-PHASE LOGIC

BACKGROUND OF THE INVENTION

1. Field of the Invention

The present invention relates to the field of scan testing; more particularly, the present invention relates to a method and apparatus for performing scan testing that reduces the number of scan cells required to achieve high test coverage.

2. Description of Related Art

A typical integrated circuit has combinational logic blocks which are coupled through latches controlled by a system clock. In many designs, the system clock has multiple phases wherein each phase is used to enable corresponding latches. In order to test the functionality and performance of a combinational logic block, various combinations of stimulus conditions are selected according to well-known methods.

Scan testing is a well-known technique for implementing multiple scan cells that are serially coupled to produce a scan chain. The scan chain serially accepts data that is applied to inputs of combinational logic blocks. The ability to directly control inputs simplifies the preparation process for a test of the combinational logic blocks. Each scan cell is also coupled to sample an output of a combinational logic block and serially shift the sampled value out of the scan chain to be compared with expected values.

To perform scan testing, a sequence of bits are applied to the head of the scan chain until all the scan cells have been initialized to the proper value, the bits are then applied to the corresponding combinational logic block, and the response is captured by a scan cell and shifted out for comparison with expected responses. Fault coverage of a test database is a measure of the percentage of modeled faults that are detectable using that test database to test the operation of a device.

Full scan devices, such as a level sensitive scan design (LSSD), include scan cells at the inputs and outputs of each combinational block. Combinational test generation techniques are then applied to generate test patterns to exercise each of the combinational blocks to provide high fault coverage. The use of scan cells at every input and output of a combinational block requires increased die area which adds to the cost of the device.

Partial scan devices use scan cells at selected inputs and outputs of each combinational block. Therefore, there may be multiple combinational blocks active in different phases of a clock signal to form a sequential circuit between each scan cell. Sequential test generation techniques are then used to exercise each of the sequential circuits between scan cells. Sequential test generation is more complex than combinational test generation. Some inputs to a combinational block may only be controllable by scanning in data to other scan cells and performing a sequence of operations to propagate the desired effect to the desired non-scan cell. Furthermore, some outputs of the combinational logic block may only be scanned out by performing a sequence of operations to propagate the output signal to a scan cell. In an integrated circuit, the complexity of determining the stimulus to be applied to these sequential circuits can be burdensome. In addition, it may not be possible or practical to apply the desired input combinations or retrieve the sampled output values using this technique. Thus, fault coverage is typically compromised.

What is needed is a method and apparatus to reduce die area by using scan cells at selected inputs and outputs of combinational logic blocks while still providing high fault coverage. What is needed is a method and apparatus to allow the use of scan cells at selected inputs and outputs of combinational logic blocks without the complex and time-consuming use of sequential test generation.

SUMMARY OF THE INVENTION

A method and apparatus for using a test signal being computed by applying a combinational test pattern generation tool to a model of the apparatus in which at least one of an at least one sequential device is modelled as a non-sequential device, the apparatus having a first scan cell configured to receive the test signal and drive a first signal in response to a first clock phase; a sequential logic block having the at least one sequential device, the sequential logic block being configured to generate a second signal, at least one of the at least one sequential device being a non-scan cell.

DETAILED DESCRIPTION

The present invention provides a method and apparatus to reduce die area by using scan cells at selected inputs and outputs of combinational logic blocks while still providing coverage associated with a full-scan design. The present invention also provides a method and apparatus to allow the use of scan cells at selected inputs and outputs of combinational logic blocks without the complex and time-consuming use of sequential test generation.

Figure 1:
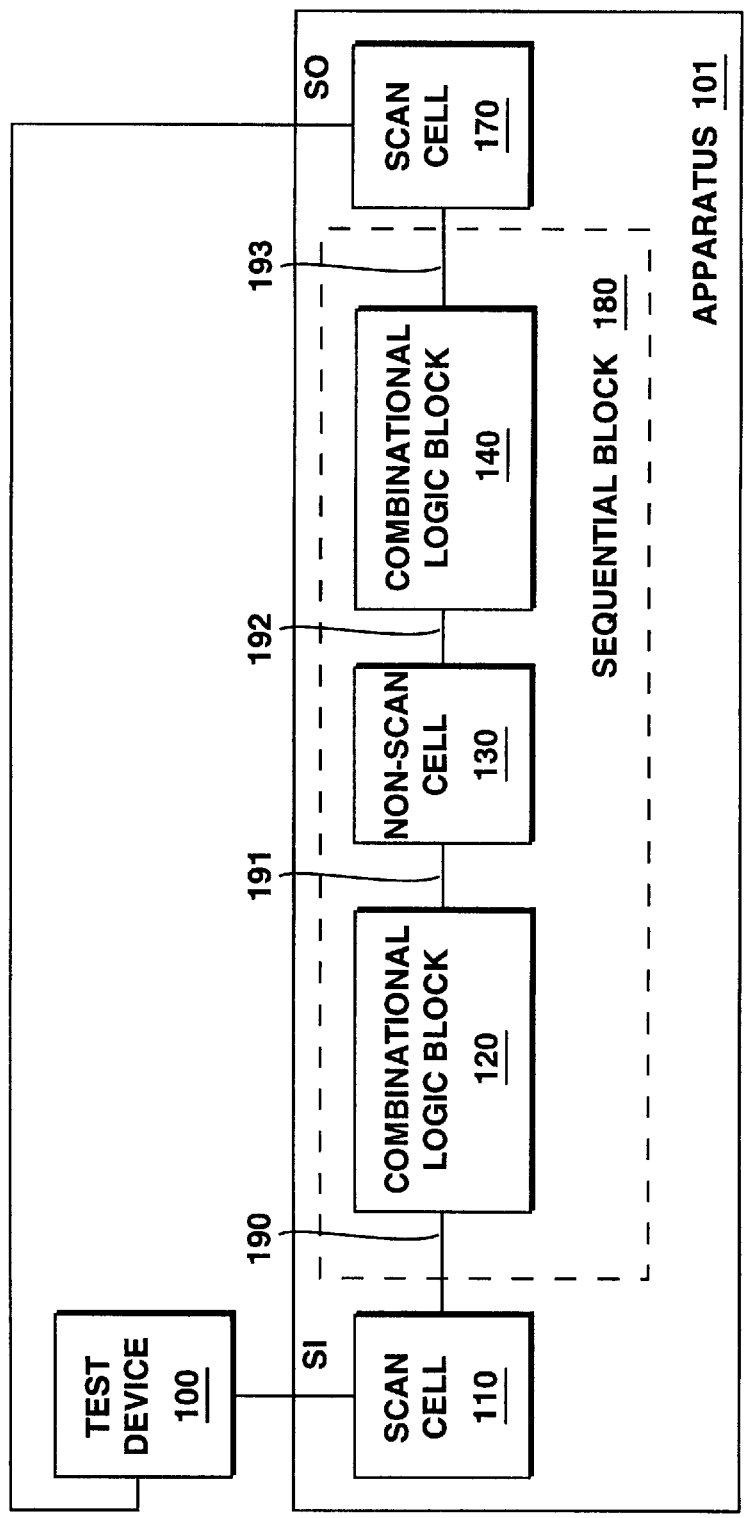
FIG. 1 illustrates one embodiment of an apparatus and system of the present invention.

FIG. 1 illustrates one embodiment of an apparatus of the present invention.

An apparatus 101 comprises a scan cell 110, a sequential block 180, and a scan cell 170. The scan cell 110 is coupled to serially receive a test signal through a scan input (SI). The scan cell 110 drives an input signal onto a node 190 in response to a first phase of a clock signal (not shown). The sequential block 180 receives the input signal and sequentially processes the input signal through two or more combinational logic blocks each corresponding to a phase of the clock signal to produce an output signal on a node 193. The scan cell 170 is coupled to latch the output signal in response to a phase of the clock signal and serially send the output signal through a scan output (SO).

In one embodiment, the sequential block 180 has a combinational block 120, a non-scan cell 130, and a combinational block 140. During the first phase of the clock signal, the combinational block 120 receives a first signal on the node 190 and generates a second signal on a node 191. During a second phase of the clock signal, the non-scan cell 130 drives the second signal on a node 192 and the second combinational block 140 receives the second signal and generates a third signal on the node 193. During the next first phase of the clock signal, the third signal is received by the scan cell 170. The third signal is then shifted out through the scan chain. Each of the combinational logic blocks within the sequential block 180 can have multiple inputs and outputs (not shown).

In another embodiment, the sequential block 180 has three combinational logic blocks coupled together through two non-scan cells. Alternatively, four or more combinational logic blocks coupled together through non-scan cells are used in each sequential block 180. In another embodiment, some of the non-scan cells of the sequential logic block 180 are implemented as scan cells.

FIG. 1 also illustrates one embodiment of a system of the present invention.

A test device 100 is coupled the apparatus 101 through the SI and SO signals. The test device 100 serially provides the test vectors through SI and serially receives the responses through SO. The responses are compared against expected values. In one embodiment, the test device 100 also provides stimulus to functional (non-scan) signals of the apparatus to initiate functional operations, for example.

Figure 2:
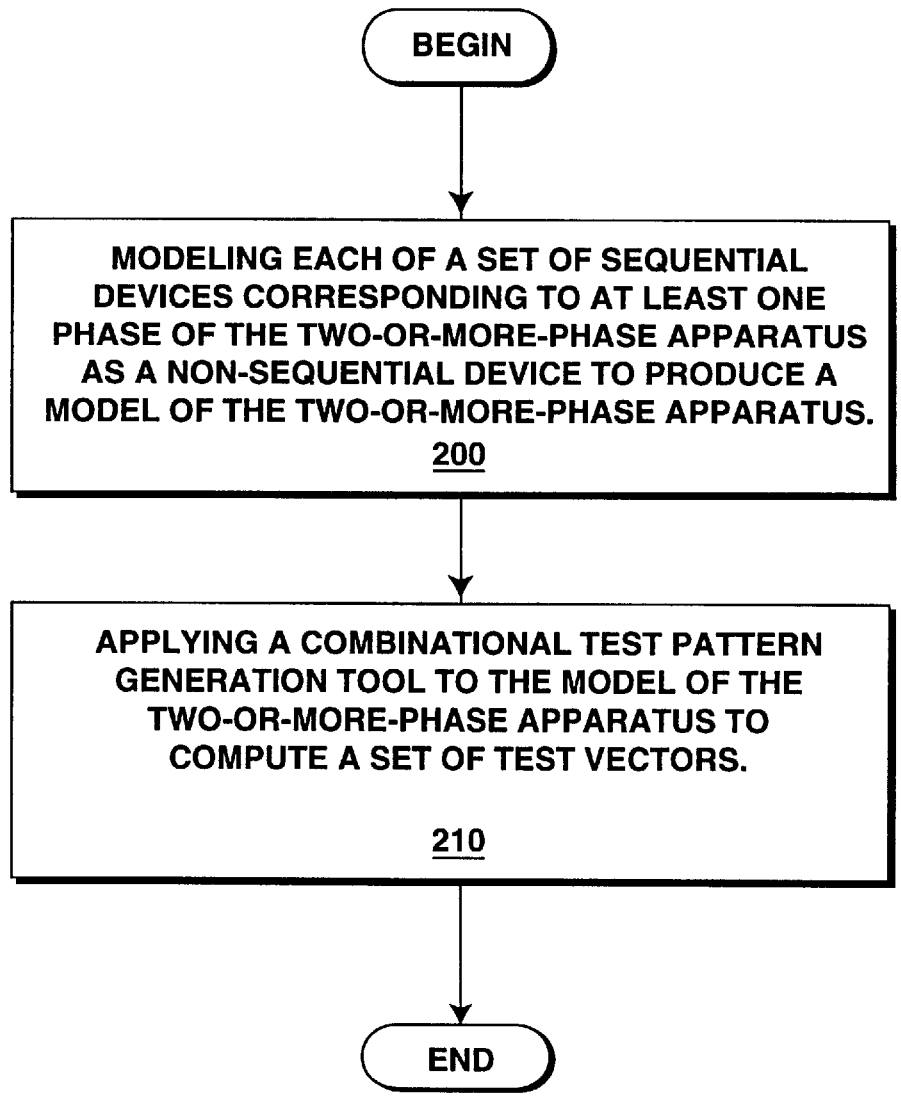
FIG. 2 illustrates one embodiment of a method of generating a set of test vectors for a two-or-more-phase apparatus.

FIG. 2 illustrates one embodiment of a method of computing a set of test vectors for a two-or-more-phase apparatus.

In step 200, a model of an two-or-more-phase apparatus is produced. Each of a set of sequential devices corresponding to at least one phase of the two-or-more-phase apparatus is modelled as a non-sequential device. For example, all non-scan latches corresponding to phase two of a two phase device may be modelled as a buffer. In one embodiment, sequential devices other than latches, such as logic that disables operation of combinational logic according to the phase of a clock signal, may be used. In addition, the sequential device may be modelled as other types of non-sequential devices, such as a wire, an inverter, or other combinational logic.

By modelling at least one sequential device as a non-sequential element, at least two of the combinational logic blocks within the sequential logic block can be modelled as a single combinational block. For example, the combinational logic preceding the sequential device, the logical equivalent of the non-sequential device used to model the sequential device, and the combinational logic following the sequential device can be modelled as a single combinational logic block. In one embodiment, three or more phases of sequential logic is modelled as a combinational logic block.

Note that there cannot be any feedback loops in the sequential logic block 180 (referring to FIG. 1) that will result in a loop that does not contain a sequential element when the model is generated. For example, the node 193 of the combinational block 140 cannot be coupled to drive an input of the combinational block 120 since it results in race conditions.

In step 210, an automatic test pattern generation (ATPG) tool is applied to the model of the apparatus to compute a set of test vectors.

In one embodiment, the sequential blocks are modelled as combinational blocks. Thus, the use of a sequential ATPG tool can be avoided. Combinational test pattern generation is simpler and faster than sequential test pattern generation.

By using the method of computing a set of test vectors for a two-or-more-phase apparatus described above, a set of test vectors are computed. The combinational ATPG tool generates the test vectors by modelling the sequential logic block without sequential elements. Thus, the clock definition during generation of the test vectors is modified such that the application of single clock phase is used to exercise the logical equivalent of multiple phases of the sequential logic block. When the test vectors are produced include an appropriate number of clock phases to propagate each input signal applied to the sequential logic block through the sequential elements before sampling the output and shifting it out for comparison with expected values. For example, if the sequential logic block is configured as shown in FIG. 1, the model of the logical equivalent of the sequential block is exercised each time the first phase of the clock causes the scan cell 110 to apply a new input signal to the sequential block. A second phase of the clock signal is not used during the simulation since the sequential element corresponding to the second phase of the clock signal is modelled as a non-sequential element. When the test pattern is applied to the apparatus 101 as opposed to being simulated by the ATPG tool, a second phase of the clock signal is necessary to propagate the signal through the sequential element 130 which corresponds to the second phase of the clock signal.

In one embodiment, the test vectors are limited to signals used to scan test such as the scan control signals and the functional clock signal. In another embodiment, the test vectors include some or all of the functional signals of the apparatus.

In one embodiment, the sequential logic block is modelled as a single combinational logic block and combinational ATPG tools are used to generate the test vectors. In another embodiment, the sequential logic block is modelled a simpler sequential logic block in that at least one sequential element but less than all the sequential elements in the sequential logic block are modelled as non-sequential elements to reduce at least two combinational logic blocks into a single combinational logic block. In this case, a sequential ATPG tool is used to generate the test vectors. However, the complexity of propagating input signals to the desired non-scan cell and propagating output signals to a scan cell tend to be reduced as the sequential logic block is reduced.

In the foregoing description, serial scan techniques were described. However, any method of providing the input data to internal sequential elements and retrieving outputs from internal sequential elements may be used.

What is claimed is:

1. An apparatus comprising:
    a first scan cell configured to receive a test signal and drive a first signal in response to a first clock phase;
    a sequential logic block having at least one sequential device, the sequential logic block being configured to generate a second signal, at least one of the at least one sequential device being a non-scan cell;
    the test signal being computed by applying a test pattern generation tool to a model of the apparatus in which at least one of the at least one sequential device is modelled as a non-sequential device.

2. The apparatus of claim 1 wherein the test pattern generation tool is a combinational test pattern generation tool.

3. The apparatus of claim 1 further comprising a second scan cell coupled to receive the second signal.

4. The apparatus of claim 1 wherein the sequential logic block comprises:
    a first combinational logic configured to receive the first signal and generate a third signal;
    a second combinational logic coupled to receive the third signal through one of the at least one sequential devices in response to a second clock phase, the second combinational logic being configured to generate the second signal.

5. The apparatus of claim 1 wherein the sequential logic block comprises:
    a plurality of combinational logic blocks coupled through the at least one sequential device, a first combinational logic block of the plurality of combinational logic blocks being configured to receive the first signal and a second combinational logic block of the plurality of combinational logic blocks being configured to generate the second signal.

6. A system comprising:

a test device configured to generate a test signal; and an apparatus coupled to the test device, the apparatus comprising:

a first scan cell configured to receive the test signal and drive a first signal in response to a first clock phase;

a sequential logic block having at least one sequential device, the sequential logic block being configured to generate a second signal, at least one of the at least one sequential device being a non-scan cell;

the test signal being computed by applying a test pattern generation tool to a model of the apparatus in which at least one of the at least one sequential device is modelled as a non-sequential device.

7. The apparatus of claim 6 wherein the test pattern generation tool is a combinational test pattern generation tool.

8. The system of claim 6 further comprising a second scan cell coupled to receive the second signal.

9. The system of claim 6 wherein the sequential logic block comprises:

a first combinational logic configured to receive the first signal and generate a third signal;

a second combinational logic coupled to receive the third signal through one of the at least one sequential devices in response to a second clock phase, the second combinational logic being configured to generate the second signal.

10. The system of claim 6 wherein the sequential logic block comprises:

a plurality of combinational logic blocks coupled through the at least one sequential device, a first combinational logic block of the plurality of combinational logic blocks being configured to receive the first signal and a second combinational logic block of the plurality of combinational logic blocks being configured to generate the second signal.

11. A method of generating a set of test vectors for a two-or-more-phase apparatus comprising the steps of:

modelling each of a set of sequential devices corresponding to at least one phase of the two-or-more-phase apparatus as a non-sequential device to produce a model of the two-or-more-phase apparatus;

applying a combinational test pattern generation tool to the model of the two-or-more-phase apparatus to produce the set of test vectors.

12. The method of claim 11 wherein the sequential device is modelled as a buffer.

13. The method of claim 11 wherein the sequential device is modelled as an inverter.

14. A set of test vectors of a two-or-more-phase apparatus, the set of test vectors being generated by:

modelling each of a set of sequential devices corresponding to at least one phase of the two-or-more-phase apparatus as a non-sequential device to produce a model of the two-or-more-phase apparatus;

applying a combinational test pattern generation tool to the model of the two-or-more-phase apparatus to produce the set of test vectors.

15. The set of test vectors of claim 14 wherein each of the set of sequential devices is modelled as a buffer.

16. The set of test vectors of claim 14 wherein each of the set of sequential devices is modelled as an inverter.

\* \* \* \* \*